(12) United States Patent
Drewes

(10) Patent No.: US 6,900,489 B2
(45) Date of Patent: *May 31, 2005

(54) REDUCING THE EFFECTS OF NÉEL COUPLING IN MRAM STRUCTURES

(75) Inventor: Joel A. Drewes, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 10/424,791

(22) Filed: Apr. 29, 2003

(65) Prior Publication Data

US 2004/0217399 A1 Nov. 4, 2004

(51) Int. Cl.[7] ............................................. H01L 29/76
(52) U.S. Cl. ...................... 257/295; 257/295; 257/421; 365/171; 365/173; 365/158
(58) Field of Search ................................ 365/171, 173, 365/158; 257/295, 421

(56) References Cited

U.S. PATENT DOCUMENTS

| | | | |
|---|---|---|---|
| 5,764,567 A | 6/1998 | Parkin | |
| 6,466,419 B1 | 10/2002 | Mao | |
| 6,714,444 B2 * | 3/2004 | Huai et al. | 365/171 |
| 2002/0030489 A1 | 3/2002 | Lenssen et al. | |
| 2002/0141120 A1 | 10/2002 | Gill | |

* cited by examiner

Primary Examiner—David Nelms
Assistant Examiner—Mai-Huong Tran
(74) Attorney, Agent, or Firm—Dickstein Shapiro Morin & Oshinsky LLP

(57) ABSTRACT

A magnetic memory element has reduced Néel coupling between a pinned layer and a free layer. The magnetic memory element includes a first pinned ferromagnet and a free ferromagnet which are separated by a barrier layer. The magnetic field direction of the pinned layer is fixed, for example, by an antiferromagnetic exchange layer. An additional ferromagnetic layer, provided in coupling relationship with the first pinned ferromagnet, offsets Néel coupling between the free ferromagnetic layer and the first pinned ferromagnet.

23 Claims, 5 Drawing Sheets

REDUCING THE EFFECTS OF NÉEL COUPLING IN MRAM STRUCTURES

RELATED APPLICATIONS

This application relates to U.S. Pat. Appl. Ser. No. 10/228,062, filed Aug. 27, 2004, which issued as U.S. Pat. No. 6,677,631 on Jan. 13, 2004, the disclosure of which is incorporated herein by reference.

BACKGROUND OF THE INVENTION

1. Field of the Invention

The present invention relates to magnetic memory elements, and more specifically, to magnetic tunnel junction devices having structures that alter the effective coercivity of free layers in the devices, and compensate for the effect of magnetostatic coupling (Néel-type coupling) between ferromagnetic layers in the devices.

2. Brief Description of the Related Art

Various types of memory are used extensively in digital systems such as microprocessor-based systems, digital processing systems, and the like. Recently, magnetic random access memory (MRAM) devices have been developed for use as non-volatile random access memory.

MRAM devices are based on magnetic memory elements. An MRAM device frequently includes several magnetic memory elements arranged in a row and column array, with circuitry for accessing information stored in individual elements in the array.

Information is stored in each magnetic memory element in the form of a resistance state of the element. An electrical resistance state of a magnetic memory element changes based on the relative orientations of magnetic moments in adjacent ferromagnetic layered structures within the magnetic memory element. The orientation of the magnetic moment in one layered structure, referred to as a "pinned" structure, is fixed as a reference, while the magnetic moment orientation of another layered structure, referred to as a "free" structure, can be changed, using an externally-applied magnetic field, for example. Changing the relative orientation of the two layered structures results in a change in the resistive state of the magnetic memory element. The different resistive states are recognizable by electronic circuitry as bit-wise storage of data.

Typically, a magnetic memory element, such as a magnetic tunnel junction (MTJ) memory element, includes free and pinned ferromagnetic layers separated by a non-magnetic spacer. In an MTJ memory element, the spacer is referred to as a tunnel junction barrier layer. When the magnetic moments of the free layer and the pinned layer are aligned in the same direction, the orientation commonly is referred to as "parallel." When the two layers have opposite magnetic moment alignment, the orientation is termed "anti-parallel."

In response to parallel and antiparallel magnetic states, magnetic elements present two different resistances to a current provided across the memory element. In magnetic memory elements, the current typically is provided in a direction perpendicular to the surfaces of the element layers. The tunnel junction barrier layer is sufficiently thin that, in the presence of adequate current, quantum-mechanical tunneling of charge carriers occurs across the barrier junction between the free and pinned ferromagnetic layers. The resistance of the device typically has minimum and maximum values corresponding respectively to parallel and anti-parallel magnetization vector orientations of the free and pinned layers.

Current miniaturization trends require that magnetic memory elements be manufactured with layers that are very thin, some layers being in the range of only tens of angstroms in thickness. At these small dimensions, minute variations in surface morphology, roughness, and constituent grain size can impact the magnetic characteristics of each layer. Further, as the trend continues toward smaller magnetic memory elements with thinner layers, the input response (coercivity) of the elements increasingly is affected by magnetic interactions between the layers, such as interlayer magnetic coupling. Interlayer magnetic coupling can result, for example, in the magnetic vector of the free layer becoming preferentially oriented in a parallel or anti-parallel direction to the pinned layer. This preferential orientation can adversely destabilize the memory element, and introduce an undesirable voltage threshold (hysteresis) which must be overcome in order to switch the magnetic moment of the free layer from one orientation to another.

Various mechanisms by which interlayer magnetic coupling occurs include: direct ferromagnetic exchange coupling via pinholes, whereby ferromagnetic bridges are formed across the spacer layer; indirect oscillatory exchange coupling; and magnetostatic, or so-called Néel-type, coupling. As the size of magnetic memory elements becomes increasingly smaller, Néel-type coupling becomes a more dominant mechanism of interlayer magnetic coupling. In addition, as the shape of magnetic memory elements becomes more circular, Néel-type coupling becomes more dominant in interlayer magnetic coupling.

An idealized structure of a representative prior art MTJ memory element 2 is shown in FIG. 1. The memory element includes a free ferromagnetic layer 4 separated from a pinned ferromagnetic layer 6 by a tunnel barrier layer 8. Layers in the memory element structure, such as the free and pinned ferromagnetic layers, may be formed as a stack of several individual sub-layers. A seed layer 10 typically is provided below the free ferromagnetic layer 4. Pinned ferromagnetic layer 6 is maintained in a single stable magnetic polarity state by an antiferromagnetic exchange (pinning) layer 12. Other layers typically are included, such as a capping layer (not shown). As noted above, a disadvantage of the prior art MTJ memory element structure shown in FIG. 1 is that Néel-type coupling occurs between pinned layer 6 and free layer 4.

A plan view of prior art MTJ structure 2 is illustrated in FIG. 2. Accompanying the trend toward increasingly smaller element size is a trend from elements having an oblong shape to elements having a more circular shape. Stray fields in elements having an oblong shape can be compensated with synthetic anti-ferromagnets or additional ferromagnetic layers, as disclosed in U.S. Pat. No. 6,677,631 to Drewes, incorporated by reference above. Other methods of compensating for stray fields become necessary in elements having a more circular shape. As the shape approaches a circle, the ratio of length to width (L:W) approaches 1, and element 20 takes on the characteristics of a closed flux device. Moreover, a more circular device switches polarity states at lower field strengths. As the L:W ratio drops below about 1.2, Néel-type coupling between layers becomes more pronounced. As a result, in the absence of an applied external field, the magnetic moment of free layer 4 will tend to orient in the parallel direction under the Néel-type coupling influence of pinned layer 6. Consequently, the free layer 4 has different magnetic field strength switching thresholds when going from a parallel state to an anti-parallel state and vice versa. This produces a magnetic field offset which must be overcome to switch the free layer 4 from one orientation to the other.

An MTJ structure is desirable in which Néel-type coupling influencing the coercivity of free layers is reduced or controlled.

BRIEF SUMMARY OF THE INVENTION

A magnetic memory element according to an embodiment of the present invention includes a pinned ferromagnetic structure, a free ferromagnetic structure, and a barrier between the pinned and free structures. The pinned ferromagnetic structure includes a pinning structure, such as an antiferromagnetic exchange layer. The pinned ferromagnetic structure includes an additional ferromagnetic layer. The additional pinned ferromagnetic layer, acting as an offset layer, reduces Néel-type coupling between the free ferromagnetic structure and the pinned ferromagnetic structure.

These and other features and advantages of the invention will be better understood from the following detailed description, which is provided in connection with the accompanying drawings.

DETAILED DESCRIPTION OF THE INVENTION

Figure 1:
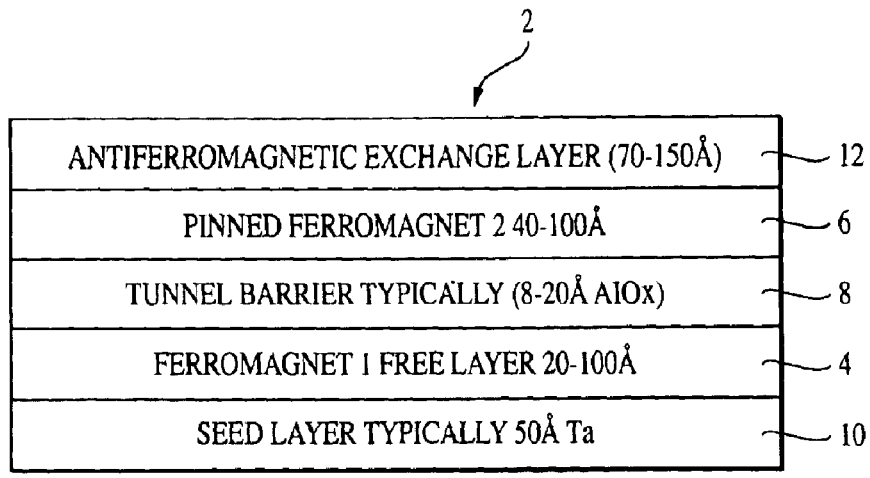
FIG. 1 illustrates a prior art MTJ MRAM memory element.
Figure 3:
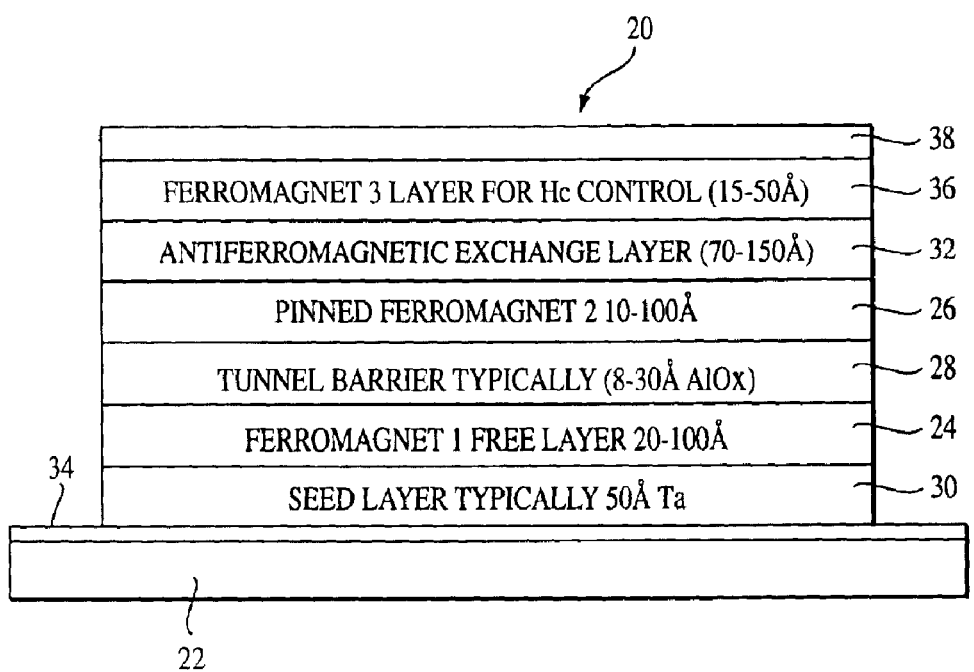
FIG. 3 illustrates an exemplary embodiment of the present invention.
Figure 2:
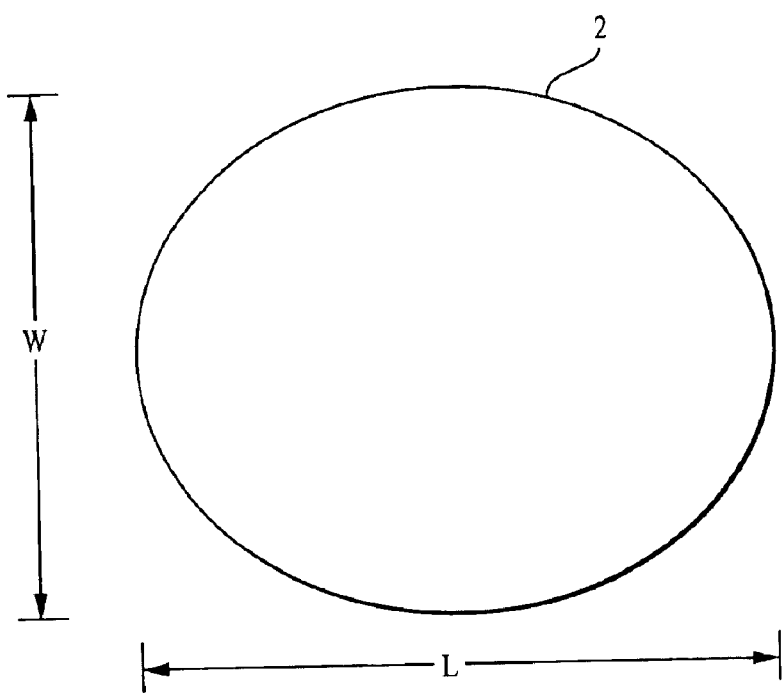
FIG. 2 is a plan view of the memory element of FIG. 1.

An idealized structure is shown in FIG. 3 for a magnetic tunnel junction magnetic memory element 20 according to an exemplary embodiment of the present invention. The memory element is formed over a substrate 22 and is fabricated using conventional film fabrication techniques. Memory element 20 includes a free ferromagnetic layer 24 made of a Ni—Fe or Co—Fe compound in a thickness of about 20–100 Å. Free ferromagnetic layer 24 is separated from a pinned ferromagnetic layer 26 by a tunnel barrier layer 28. The pinned layer 26 is about 40–100 Å in thickness. The free and pinned ferromagnetic layers may each be formed as a plurality of stacked individual layers. A seed layer 30 typically is provided below the free ferromagnetic layer 24. Pinned ferromagnetic layer 26 is pinned by an antiferromagnetic exchange layer 32.

Seed layer 30 is formed to a thickness of about 50 Å over a conductive layer 34 which provides an electrical connection to the memory element. The tunnel barrier layer 28 typically is made of $Al_2O_3$, and is about 8–30 Å thick, more preferably about 15–20 Å. Pinned ferromagnetic layer 26 characteristically is formed of a Co—Fe or Ni—Fe compound about 10–100 Å, preferably about 10–30 Å. According to FIG. 3, a generalized method of forming the memory element 20 includes forming the various layers in the order indicated from the lowermost layer to the uppermost layer.

The magnetization direction of pinned ferromagnetic layer 26 is fixed by antiferromagnetic exchange layer 32 formed over pinned ferromagnetic layer 26. Antiferromagnetic exchange layer 26 generally is formed of iridium manganese (IrMn) or platinum manganese (PtMn), and has a thickness of about 70–150 Å.

Figure 4:
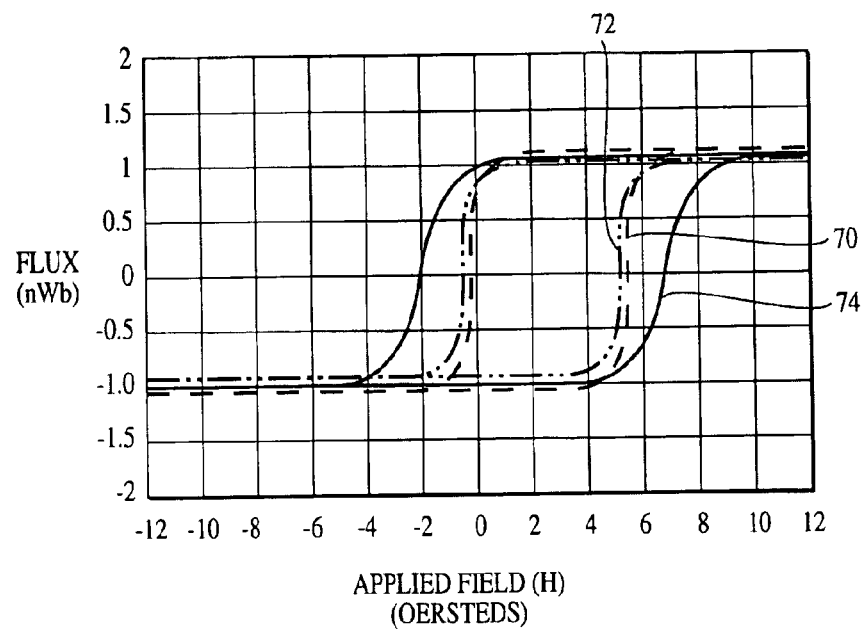
FIG. 4 is a plot of hysteresis loops for unpatterned magnetic stacks showing comparative ferromagnetic exchange and coercivity in exemplary ferromagnetic structures of the present invention.

As noted above, the directional orientation of a magnetic domain of free layer 24 is affected by pinned ferromagnet 26 as a result of undesired Néel-type coupling. FIG. 4 illustrates the change in Néel-type coupling and coercivity brought about by the presence of an added ferromagnetic layer 36. The plots show hysteresis loops for unpatterned magnetic stacks. The x axis, measured in Oersteds, shows the applied field, or H. The y axis shows the resultant flux from the material on the wafer. Briefly, when layer 36 is increased, the resultant switching characteristics of the free layer 24 are impacted. This is used to modify or control the characteristics of the free layer in devices that do not have anisotropy imparted by any specific shape.

Each hysteresis loop 70, 72, and 74 includes a forward, or positive, sweep, and a backward, or negative, sweep. Trace 70 (dashed) represent results from a magnetic memory element having no added ferromagnetic layer 36. Trace 72 (hatched) represent results from a magnetic memory element having a 15 Å ferromagnetic layer 36. Trace 74 (solid) represent results from a magnetic memory element having a 30 Å ferromagnetic layer 36.

As a result of adding ferromagnetic layer 36, ferromagnetic exchange and coercivity is changed due to a reduction in the effect of ferromagnetic exchange across the tunnel barrier. Pinned ferromagnetic layer 36 establishes a magnetic coupling with pinned ferromagnet 26. The 15 Å additional film layer 36 begins to reduce the Néel coupling, causing a shift down in the $H_{ex}$ or offset position. As the thickness of layer 36 is increased, the plot shifts down more, that is, the Hex or the offset goes to near zero. The reason the coercivity ($H_c$ or width of the loop) increases is that the result of the removal of the Néel coupling, which acts as a bias. The substantial increase in the offset between the 15 Å layer and the 30 Å layer may be significant from the standpoint of magnetic dead layers (ferromagnetic layers of such small thickness as to have no magnetic activity.) The 15 Å film in application may only have a few Angstroms of magnetically active material, and therefore may not have much moment left when it mixes with layer 32 on which it is deposited, as well as with the capping layer 38 on top. Consequently, the major shift in the thickness range between 15 Å and 30 Å likely is due to the addition of magnetically active layers.

Referring again to FIG. 4, the thickness of pinned ferromagnetic layer 36 is proportional to the amount of coercivity offset provided, but does not affect the magnitude (nWb) of the signal required to switch the orientation of the magnetic moment, indicating that the additional pinned ferromagnetic layer 36 does not switch with the free ferromagnetic layer 24. Coercivity (hysteresis), is a property of magnetic material used as a measure of the amount of applied magnetic field (of opposite polarity) required to induce a change in magnetization of a material, i.e., taking the media from a parallel to an anti-parallel state.

The pinned ferromagnetic layer 36 is formed at a thickness of about 15–50 Å. Ferromagnetic layer 36 could be thicker or thinner, depending on the thicknesses and magnetic characteristics of the other layers in the magnetic memory element. Although thicker layers can be used, it is preferred to maintain a layer 36 thickness such that the switching characteristics of the free layer 24 are optimized and do not include switching of layer 36. Accordingly, a preferred maximum thickness for layer 36 is about 50 Å.

A capping layer 38 is formed over the ferromagnetic layer 36, and a conducting layer may be provided over the capping layer 38 which is electrically coupled to ferromagnetic layer 36. It should be understood that while the memory element of FIG. 3 has been described as containing various material layers, e.g., 24, 26, 28, 32, 34, 36, and 38, each of those layers may, in fact, be formed of a plurality of thin film sub-layers.

The addition of ferromagnetic layer 36 is understood to impart Néel coupling between layers 36 and 26, particularly with respect to dipoles located in the surface of layer 26 that is closest to layer 36. This effectively limits the Néel coupling between layers 26 and 24 to those dipoles in layer 26 that are closest to layer 24, thereby effectively reducing the Néel coupling taking place across the tunnel barrier layer 28.

Figure 6:
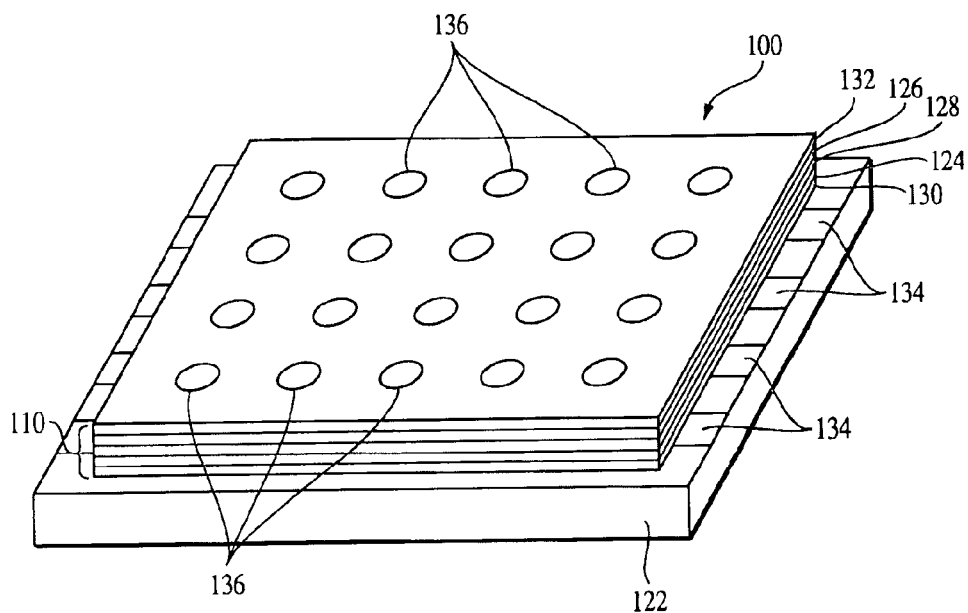
FIG. 6 illustrates an alternative implementation of a magnetic random access memory array according to another exemplary embodiment of the present invention.

Various techniques known in the art can be used to form devices according to the present invention, such as those illustrated in FIGS. 3 and 6. Layers of the device can be deposited sequentially, for example, by sputtering, evaporation, metalorganic chemical vapor deposition (MOCVD), and electroplating. Although the exemplary memory elements are shown with a free layer on the bottom and other layers formed above, it will be clear to those of skill in the art that the memory element could have the opposite configuration, with a free layer on top. Other constructions or orientations of the elements are contemplated as being encompassed by the present invention. Etching of materials can take place by ion etch, reactive ion etch, wet chemistry, and electro-chemistry, for example. All of the examples above are non-limiting.

Figure 5:
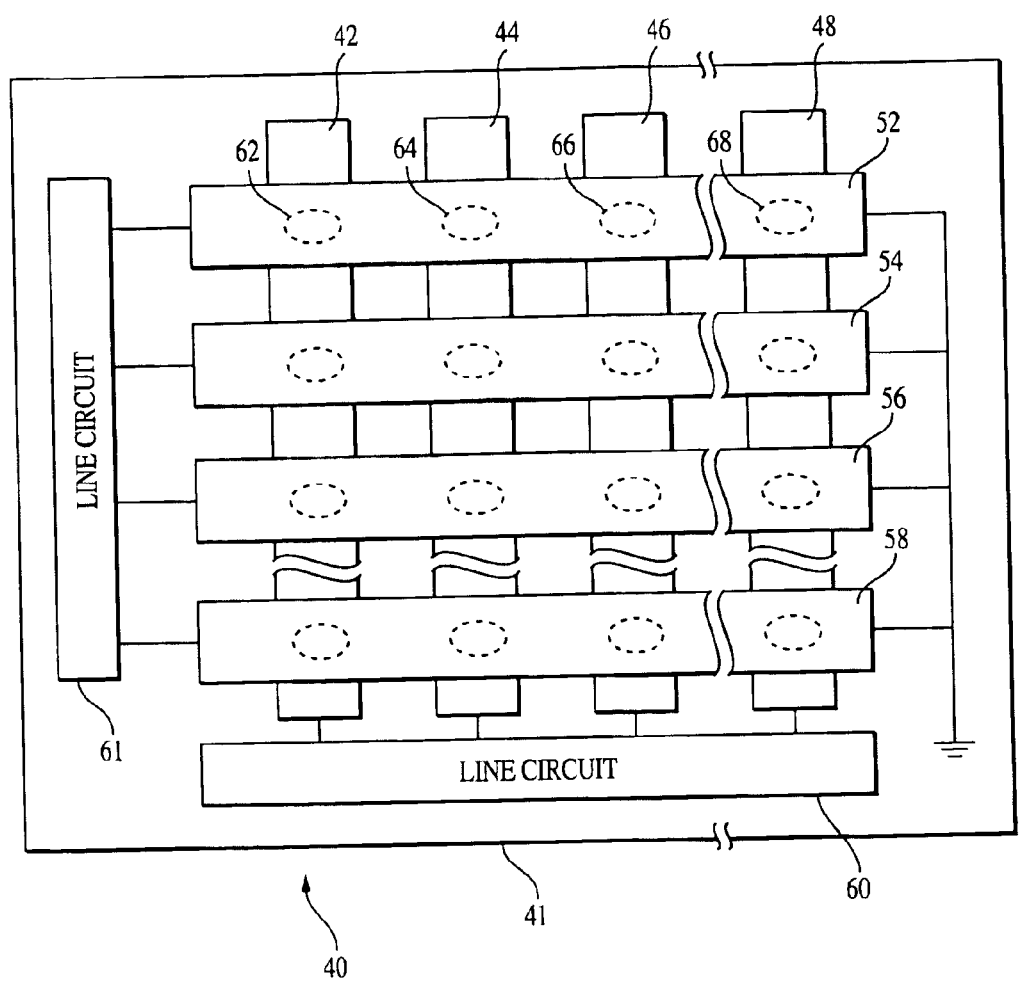
FIG. 5 illustrates a magnetic random access memory according to an exemplary embodiment of the present invention.

Referring to FIG. 5, an MRAM array 40 according to an exemplary embodiment of the present invention is illustrated. Array 40 is formed over a substrate 41 and includes column lines 42, 44, 46, and 48, and row lines 52, 54, 56, and 58. Columns and rows are selected by column and row line circuits 60 and 61, respectively. At the intersection of each column and row line is an MTJ memory element fabricated in accordance with the invention and designated as 62, 64, 66, and 68.

FIG. 6 illustrates an intermediate step in forming an MRAM array 100 according to an exemplary embodiment of the present invention. Array 100 includes a substrate 122 on which is provided a plurality of conductors 134. An MRAM stack 110 formed on the substrate 122 includes seed layer 130, free ferromagnetic layer 124, spacer/barrier layer 128, pinned ferromagnetic layer 126, and antiferromagnetic exchange layer 132. Memory elements are defined within the array stack 110 by formation of ferromagnetic layer components 136: Components 136 can be patterned, as circles for example, by removing a ferromagnetic layer. Electrically isolated elements, as described above, can be produced by removing the bulk, from around components 136, such as by a series of etching operations. Upper conductors (not shown) can be provided.

Figure 7:
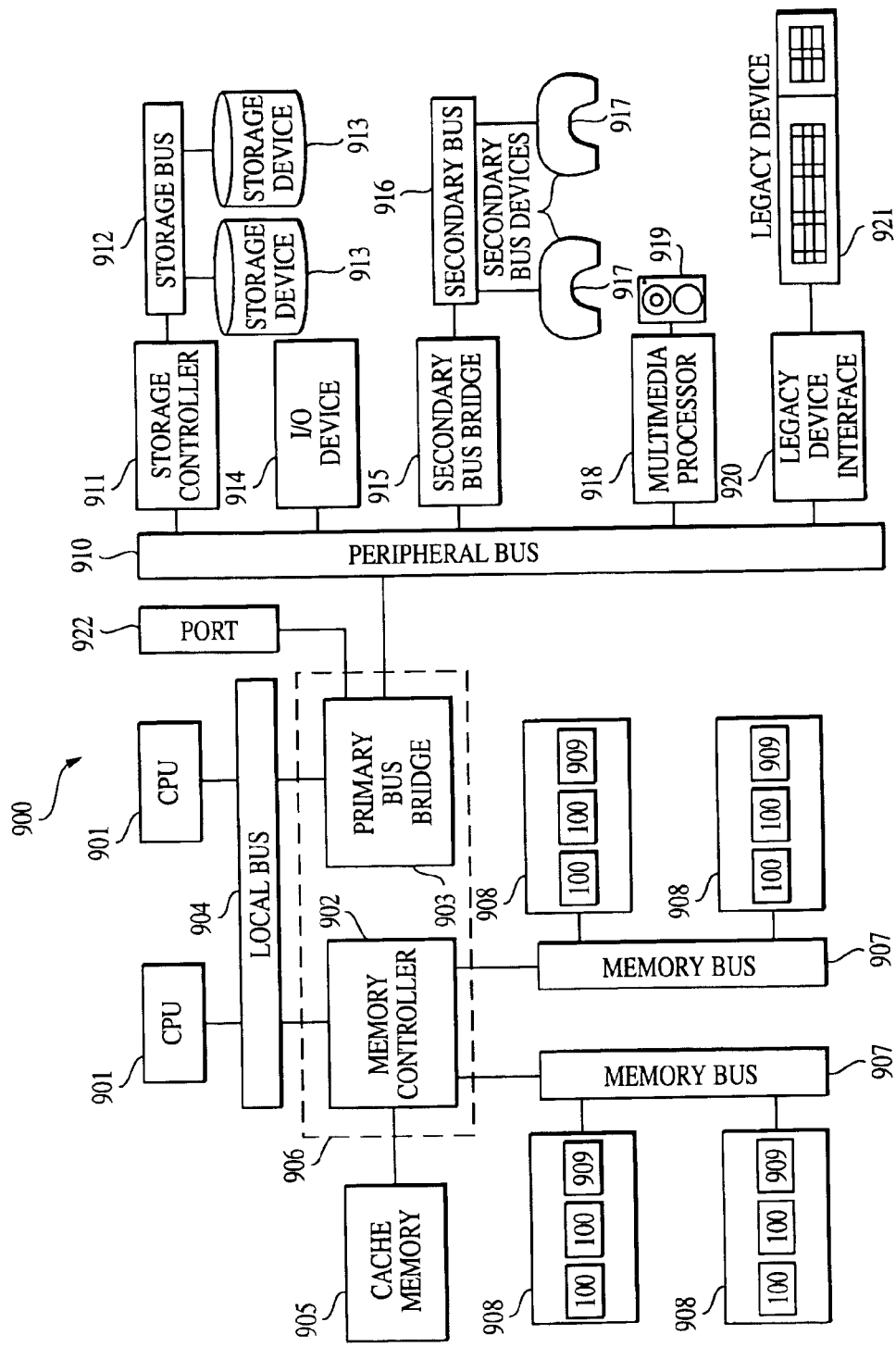
FIG. 7 illustrates a microprocessor-based system that utilizes magnetic memory as in FIG. 5.

FIG. 7 illustrates an exemplary processing system 900 which may utilize a memory device 100 based on a memory array 40 of the present invention. The processing system 900 includes one or more processors 901 coupled to a local bus 904. A memory controller 902 and a primary bus bridge 903 are also coupled the local bus 904. The processing system 900 may include multiple memory controllers 902 and/or multiple primary bus bridges 903. The memory controller 902 and the primary bus bridge 903 may be integrated as a single device 906.

The memory controller 902 is also coupled to one or more memory buses 907. Each memory bus accepts memory components 908 which include at least one memory device 100 of the present invention. The memory components 908 may be a memory card or a memory module. Examples of memory modules include single inline memory modules (SIMMs) and dual inline memory modules (DIMMs). The memory components 908 may include one or more additional devices 909. For example, in a SIMM or DIMM, the additional device 909 might be a configuration memory, such as a serial presence detect (SPD) memory. The memory controller 902 may also be coupled to a cache memory 905. The cache memory 905 may be the only cache memory in the processing system. Alternatively, other devices, for example, processors 901 may also include cache memories, which may form a cache hierarchy with cache memory 905. If the processing system 900 include peripherals or controllers which are bus masters or which support direct memory access (DMA), the memory controller 902 may implement a cache coherency protocol. If the memory controller 902 is coupled to a plurality of memory buses 907, each memory bus 907 may be operated in parallel, or different address ranges may be mapped to different memory buses 907.

The primary bus bridge 903 is coupled to at least one peripheral bus 910. Various devices, such as peripherals or additional bus bridges may be coupled to the peripheral bus 910. These devices may include a storage controller 911, a miscellaneous I/O device 914, a secondary bus bridge 915 communicating with a secondary bus 916, a multimedia processor 918, and a legacy device interface 920. The primary bus bridge 903 may also coupled to one or more special purpose high speed ports 922. In a personal computer, for example, the special purpose port might be the Accelerated Graphics Port (AGP), used to couple a high performance video card to the processing system 900.

The storage controller 911 couples one or more storage devices 913, via a storage bus 912, to the peripheral bus 910. For example, the storage controller 911 may be a SCSI controller and storage devices 913 may be SCSI discs. The I/O device 914 may be any sort of peripheral. For example, the I/O device 914 may be a local area network interface, such as an Ethernet card. The secondary bus bridge 915 may be used to interface additional devices via another bus to the processing system. For example, the secondary bus bridge may be a universal serial bus (USB) controller used to couple USB devices 917 via to the processing system 900. The multimedia processor 918 may be a sound card, a video capture card, or any other type of media interface, which may also be coupled to one additional devices such as speakers 919. The legacy device interface 920 is used to couple at least one legacy device 921, for example, older styled keyboards and mice, to the processing system 900.

The processing system 900 illustrated in FIG. 6 is only an exemplary processing system with which the invention may be used. While FIG. 6 illustrates a processing architecture especially suitable for a general purpose computer, such as a personal computer or a workstation, it should be recognized that well known modifications can be made to configure the processing system 900 to become more suitable for use in a variety of applications. For example, many electronic devices which require processing may be implemented using a simpler architecture which relies on a CPU 901 coupled to memory components 908 and/or memory devices 100. These electronic devices may include, but are not limited to audio/video processors and recorders, gaming consoles, digital television sets, wired or wireless telephones, navigation devices (including system based on the global positioning system (GPS) and/or inertial navigation), and digital cameras and/or recorders. The modifications may include, for example, elimination of unnecessary components, addition of specialized devices or circuits, and/or integration of a plurality of devices.

While various embodiments of the invention have been described and illustrated above, it should be understood that these are exemplary of the invention and are not to be considered as limiting. Additions, deletions, substitutions, and other modifications can be made without departing from the spirit or scope of the present invention. Accordingly, the invention is not to be considered as limited by the foregoing description but is only limited by the scope of the appended claims.

What is claimed as new and desired to be protected by Letters Patent of the United States is:

1. A magnetic memory element comprising:
   a pinned ferromagnetic layer maintained in a single stable magnetic polarity state;
   a pinning structure for maintaining the stable magnetic polarity state of the pinned ferromagnetic layer;
   a free ferromagnetic layer;
   a barrier layer between the pinned and the free layers; and
   an additional ferromagnetic layer on a side of the pinning structure opposite the pinned ferromagnetic layer.

2. A memory element as in claim 1, wherein the pinning structure comprises an antiferromagnetic exchange layer is made up of one of IrMn and PtMn.

3. A memory element as in claim 1, wherein the memory element has no shape-induced anisotropy.

4. A memory element as in claim 1, wherein at least one of the free and pinned layers comprises a layer of at least one of Co—Fe and Ni—Fe.

5. A memory element as in claim 1, further comprising conductive layers in electrical contact with the free layer and the additional ferromagnetic layer.

6. A memory element as in claim 1, wherein a ratio of a length of the memory element to a width of the memory element is less than or equal to about 1.2.

7. A magnetic tunnel junction device having memory elements comprising:
   a first pinned ferromagnetic layer having a magnetic polarity maintained in a single, stable state;
   an antiferromagnetic exchange layer for pinning the polarity of the first pinned ferromagnetic layer;
   a free ferromagnetic layer;
   a tunnel junction barrier layer between the first pinned ferromagnetic layer and the free layer; and
   a second pinned ferromagnetic layer on a side of the antiferromagnetic exchange layer opposite the first pinned ferromagnetic layer, the second pinned ferromagnetic layer offsets Néel-type coupling between the free layer and the first pinned ferromagnetic layer.

8. A magnetic tunnel junction device as in claim 7, wherein the antiferromagnetic exchange layer comprises at least one of IrMn and PtMn.

9. A magnetic tunnel junction device as in claim 7, further comprising conductive layers in electrical contact with the free layer and the second pinned ferromagnetic layer.

10. A magnetic random access memory including an array of memory elements, each memory element comprising:
    a first pinned ferromagnetic layer having a stable magnetic polarity;
    a free ferromagnetic layer;
    a barrier layer between the first pinned ferromagnetic layer and the free ferromagnetic layer;
    an antiferromagnetic exchange layer for pinning the first pinned ferromagnetic layer, and
    a second pinned ferromagnetic layer disposed on a side of the antiferromagnetic exchange layer opposite the first pinned ferromagnetic layer.

11. A magnetic random access memory as in claim 10, wherein the antiferromagnetic exchange layer in each memory element comprises a layer of at least one of IrMn and PtMn.

12. A magnetic random access memory as in claim 10, wherein the memory elements have no shape-induced anisotropy.

13. A magnetic random access memory as in claim 10, further comprising conductive layers in electrical contact with the free layer and the offset layer.

14. A magnetic random access memory as in claim 10, wherein the memory elements are arranged separately in a row and column array.

15. A processor system comprising:
    a processor; and
    a magnetic random access memory device for exchanging data with the processor, the memory device comprising an array of memory elements, each memory element comprising:
    a first pinned ferromagnetic layer;
    an antiferromagnetic exchange layer for pinning the first pinned ferromagnetic layer;
    a free ferromagnetic layer;
    a barrier layer separating the first pinned ferromagnetic layer and the free ferromagnetic layer; and
    a second pinned ferromagnetic layer on a side of the antiferromagnetic exchange layer opposite the first pinned ferromagnetic layer.

16. A processor system as in claim 15, wherein the memory elements have no shape-induced anisotropy.

17. A processor system comprising:
    a processor; and
    a magnetic random access memory device for exchanging data with the processor, the memory device comprising an array of memory elements, each memory element comprising:
    a barrier layer separating a first pinned ferromagnetic layer and a free ferromagnetic layer; and
    a second pinned ferromagnetic layer for offsetting Néel-type coupling between the free ferromagnetic layer and the first pinned ferromagnetic layers and disposed on a side of the first pinned ferromagnetic layer opposite the free ferromagnetic layer.

18. A processor system as in claim 17, wherein the memory elements have no shape-induced anisotropy.

19. A magnetic memory element comprising:
    a pinned structure with a fixed magnetic moment orientation, the pinned structure including first and second ferromagnetic layers, and an antiferromagnetic layer between the first and second ferromagnetic layers;
    a free structure with a changeable magnetic moment orientation, the free structure including at least one free ferromagnetic layer and disposed adjacent the pinned structure; and
    a barrier layer between the pinned structure and the free structure.

20. The magnetic memory element of claim 19, wherein the memory element has no shape-induced anisotropy.

21. A magnetic memory element comprising:
   a seed layer;
   a free ferromagnetic structure formed on the seed layer;
   a pinned ferromagnetic structure;
   a tunnel barrier structure between the free ferromagnetic structure and the pinned ferromagnetic structure;
   an antiferromagnetic exchange structure adjacent the pinned ferromagnetic structure; and
   an additional pinned ferromagnetic structure formed adjacent the antiferromagnetic exchange structure on a side opposite the pinned ferromagnetic structure, wherein the magnetic memory element has no shape-induced anisotropy, the additional pinned ferromagnetic structure controlling Néel-type coupling between ferromagnetic structures in the magnetic memory element.

22. A magnetic random access memory including an array of memory elements, each memory element comprising:
   a pinned structure with a fixed magnetic moment orientation, the pinned structure including first and second ferromagnetic layers, and an antiferromagnetic layer between the first and second ferromagnetic layers;
   a free structure with a changeable magnetic moment orientation, the free structure including at least one free ferromagnetic layer and disposed adjacent the pinned structure; and
   a barrier layer between the pinned structure and the free structure.

23. A processor system comprising:
   a processor; and
   a magnetic random access memory device for exchanging data with the processor, the memory device comprising an array of memory elements, each memory element comprising:
      a pinned structure with a fixed magnetic moment orientation, the pinned structure including first and second ferromagnetic layers, and an antiferromagnetic layer between the first and second ferromagnetic layers;
      a free structure with a changeable magnetic moment orientation, the free structure including at least one free ferromagnetic layer and disposed adjacent the pinned structure; and
      a barrier layer between the pinned structure and the free structure.

* * * * *

UNITED STATES PATENT AND TRADEMARK OFFICE
CERTIFICATE OF CORRECTION

PATENT NO. : 6,900,489 B2
DATED : May 31, 2005
INVENTOR(S) : Joel A. Drewes

It is certified that error appears in the above-identified patent and that said Letters Patent is hereby corrected as shown below:

Column 4,
Lines 39-40, "The reason the coercivity" should read -- The coercivity --;
Lines 40-41, "is that the result" should read -- as a result --;

Column 6,
Line 21, "900 include" should read -- 900 includes --;
Line 35, "also coupled" should read -- also be coupled --;
Line 50, "917 via to" should read -- 917 to --;
Line 53, "to one additional" should read -- to additional --;

Column 7,
Line 4, "system" should read -- systems --;
Line 32, "layer is" should read -- layer --.

Signed and Sealed this

Twenty-first Day of February, 2006

JON W. DUDAS
*Director of the United States Patent and Trademark Office*